United States Patent
Hariri et al.

[11] Patent Number: 5,935,327
[45] Date of Patent: Aug. 10, 1999

[54] APPARATUS FOR GROWING SILICON CRYSTALS

[75] Inventors: Farouk A. Hariri; Michael D. Dangel; H. Michael Grimes, all of Plano, Tex.

[73] Assignee: Texas Instruments Incorporated, Dallas, Tex.

[21] Appl. No.: 08/853,874

[22] Filed: May 9, 1997

Related U.S. Application Data

[60] Provisional application No. 60/017,215, May 9, 1996.

[51] Int. Cl.$^6$ .................................................. C30B 35/00
[52] U.S. Cl. ............................ 117/218; 117/32; 117/218; 117/917
[58] Field of Search ................................ 117/30, 32, 201, 117/202, 218, 917

[56] References Cited

U.S. PATENT DOCUMENTS

| | | | |
|---|---|---|---|
| 4,565,671 | 1/1986 | Matutani et al. | 117/217 |
| 4,592,895 | 6/1986 | Matsutani et al. | 117/202 |
| 4,830,703 | 5/1989 | Matsutani | 423/348 |
| 5,009,865 | 4/1991 | Boden et al. | 117/202 |

*Primary Examiner*—Felisa Hiteshew
*Attorney, Agent, or Firm*—Mark A. Valetti; Carlton H. Hoel; Richard L. Donaldson

[57] ABSTRACT

An apparatus for producing silicon crystals (24) having highly uniform characteristics from a silicon melt (22) comprising a furnace (12), a crucible (14) disposed within the furnace (12) for containing the silicon melt (22), a heater (20) disposed around the crucible (14) for heating the silicon melt (22) and a pair of cusp magnets (28, 30) disposed around the furnace (12) and spaced a distance apart from one another such that the distance between the cusp magnets (28, 30) is variable.

8 Claims, 2 Drawing Sheets

APPARATUS FOR GROWING SILICON CRYSTALS

This application claims priority under 35 USC § 119(e)(1) of provisional application No. 60/017,215 filed May 9, 1996.

TECHNICAL FIELD OF THE INVENTION

This invention relates, in general, to growing silicon crystals from a silicon melt, and in particular to, growing silicon crystals having highly uniform characteristics by varying the distance between cusp magnets.

BACKGROUND OF THE INVENTION

Without limiting the scope of the invention, its background is described in connection with growing silicon crystals, as an example.

Heretofore, in this field, silicon crystals have been produced by melting silicon along with a variety of dopants, such as boron or phosphorous, in a quartz crucible located within a furnace. A heater, also located within the furnace, provides heat which liquefies the silicon and the dopants in the crucible at a temperature around 1450° C. Once the silicon is liquefied, a rotating seed is inserted into the melt. The seed is then slowly retracted, allowing the silicon to solidify thereon to create a generally cylindrically shaped silicon crystal. The silicon crystal is subsequently cut into wafers which are cleaned, polished and etched to become an integral part of an integrated circuit.

It has been found, however, that the quality of the integrated circuit is dependent upon the characteristics of the silicon used to manufacture the integrated circuit. For example, the amount of oxygen in the silicon must be strictly controlled, both in terms of the radial oxygen gradient, a ratio of the oxygen near the center of the silicon crystal compared to the oxygen near the outer edge of the silicon crystal, and in terms of the axial oxygen gradient, a ratio of the oxygen near the top of the silicon crystal as compared to the oxygen near the bottom of the silicon crystal.

Oxygen enters the silicon in a reaction along the interface between the liquid silicon and the quartz crucible, forming $SiO_x$. The oxygen-rich silicon near the surface of the crucible is mixed throughout the liquid silicon due to the swirling effect of silicon flux. Silicon flux is a result of the temperature gradients and density gradients within the silicon melt which are a result of the heat transfer from the heater through the crucible to the silicon melt. The area near the surface of the crucible is hotter than the area near the middle of the crucible, causing the density of the silicon near the surface to be less than the density of the silicon near the middle. This results in a swirling effect in which the silicon near the surface of the crucible rises while the silicon near the center of the crucible falls, thereby mixing oxygen throughout the silicon melt.

To minimize silicon flux, cusp magnets have been utilized. Typically, a pair of cusp magnets are used together, one providing a negatively charged magnetic flux while the other providing a positively charged magnetic flux. The magnets are oriented along the exterior of the furnace in a one above the other configuration. During the production of a silicon crystal, the magnetic flux tends to minimize the silicon flux reducing the mixing of oxygen into the silicon melt and producing a silicon crystal having more uniform characteristics.

SUMMARY OF THE INVENTION

It has been discovered, however, that conventional cusp magnets are unable to achieve certain characteristics throughout an entire silicon crystal. What is needed, therefore, is an apparatus and a method for producing a silicon crystal having highly uniform characteristics throughout the entire crystal.

The present invention disclosed herein comprises a furnace, a crucible disposed within the furnace for containing the silicon melt, a heater disposed around the crucible for heating the silicon melt and a pair of cusp magnets disposed around the furnace which are adjustable relative to one another such that the distance between the cusp magnets is controllable, thereby controlling the magnetic flux.

The distance between the cusp magnets may be adjusted by holding the lower magnet in a constant position relative to the furnace and moving the upper magnet toward or away from the lower magnet. Similarly, the distance between the cusp magnets may be adjusted by holding the lower magnet in a constant position relative to the furnace and moving the upper magnet toward or away from the lower magnet. For example, the lower magnet may be supported by an adjustable platform which provides for upward and downward motion of the lower magnet.

The distance between the cusp magnets may be manually adjustable or may be computer controlled. The distance between the cusp magnets may be adjusted between crystal production runs or during crystal production runs, depending on the required characteristics of the silicon crystal.

These and other features of the present invention will be apparent to those skilled in the art from the following detailed description of the invention, taken together with the accompanying drawings.

DESCRIPTION OF THE DRAWINGS

In the drawings.

Corresponding numerals and symbols in different figures refer to corresponding parts unless otherwise indicated.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
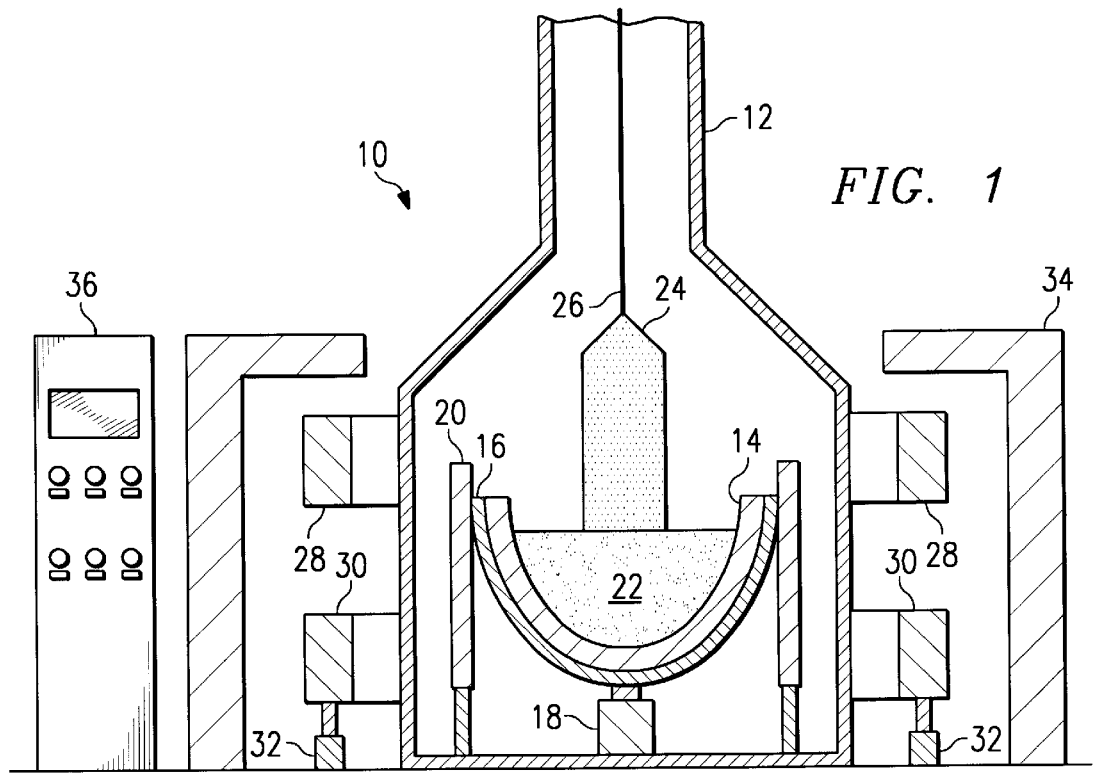
FIG. 1 is a schematic diagram of an apparatus for producing silicon crystals of the present invention.

In FIG. 1, an apparatus for producing silicon crystals having highly uniform characteristics using variable cusp magnets is generally designated 10. A furnace 12 contains quartz crucible 14. Surrounding crucible 14 is a graphite susceptor 16. Crucible 14 is supported by adjustable stand 18. Surrounding crucible 14 is a cylindrical heater 20 which is typically graphite. Inside crucible 14 is silicon melt 22 which is formed by melting solid silicon with various dopants such as boron and phosphorous at temperatures in excess of 1400° C.

Silicon crystal 24 is supported by seed 26 as silicon crystal 24 is produced from silicon melt 22. Silicon crystal 24 is produced by slowly retracting seed 26 out of silicon melt 22 and allowing silicon melt 22 to solidify in a controlled manner. Silicon crystal 24 is generally cylindrical and has a diameter that is determined by the rate at which seed 26 is retracted from silicon melt 22. As silicon crystal 24 is produced from silicon melt 22, crucible 14 is raised by stand 18 in order to maintain a constant silicon melt 22 level relative to furnace 12.

Encircling furnace 12 is cusp magnet 28 and cusp magnet 30. Cusp magnet 30 is supported by adjustable platform 32 which provides for upward and downward motion of cusp magnet 30 and allows the distance between cusp magnet 28 and cusp magnet 30 to be varied. It should be understood by one skilled in the art that adjustable platform 32 may be designed in a variety of conventional configurations that are equally well-suited for the present invention. Such configurations may include, but are not limited to, a hydraulic piston and cylinder system or a plurality of rotating shafts.

Cusp magnet 30 may be manually adjusted either between production runs or during production runs. The adjustment of cusp magnet 30 may also be automated into the silicon crystal 24 production process and controlled by computer hardware or software within control panel 36 which controls the temperature of silicon melt 22, the level of silicon melt 22 and the rate at which silicon crystal 24 is extracted from silicon melt 22 on seed 26.

Surrounding furnace 12 and cusp magnets 28, 30 is shield 34. Shield 34 provides protection to the operators of furnace 12 from the magnetic flux generated by cusp magnets 28, 30. Upper magnet 28 and lower magnet 30 are disposed between shield 34 and furnace 12. Shield 34 extends from a point lower than the bottom of lower magnet 30 to a point above the top of upper magnet 28 and extending over upper magnet 28. This is illustrated in FIGS. 1–3.

Even though FIG. 1 depicts the lower cusp magnet 30 as the magnet which can be adjusted, it should be understood by one skilled in the art that having an adjustable upper cusp magnet 28 is equally well-suited for the present invention so long as the distance between cusp magnet 28 and cusp magnet 30 is controllable.

Figure 2:
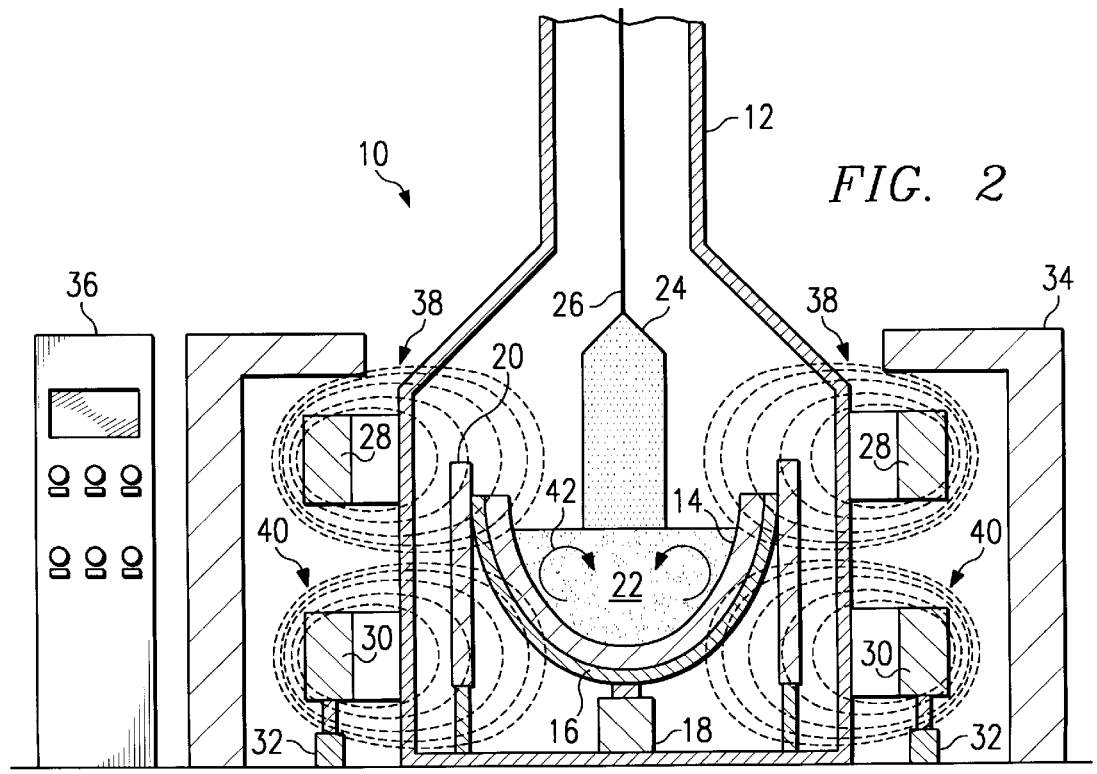
FIG. 2 is a schematic diagram showing an apparatus for producing silicon crystals in operation with the cusp magnets in a first position.
Figure 3:
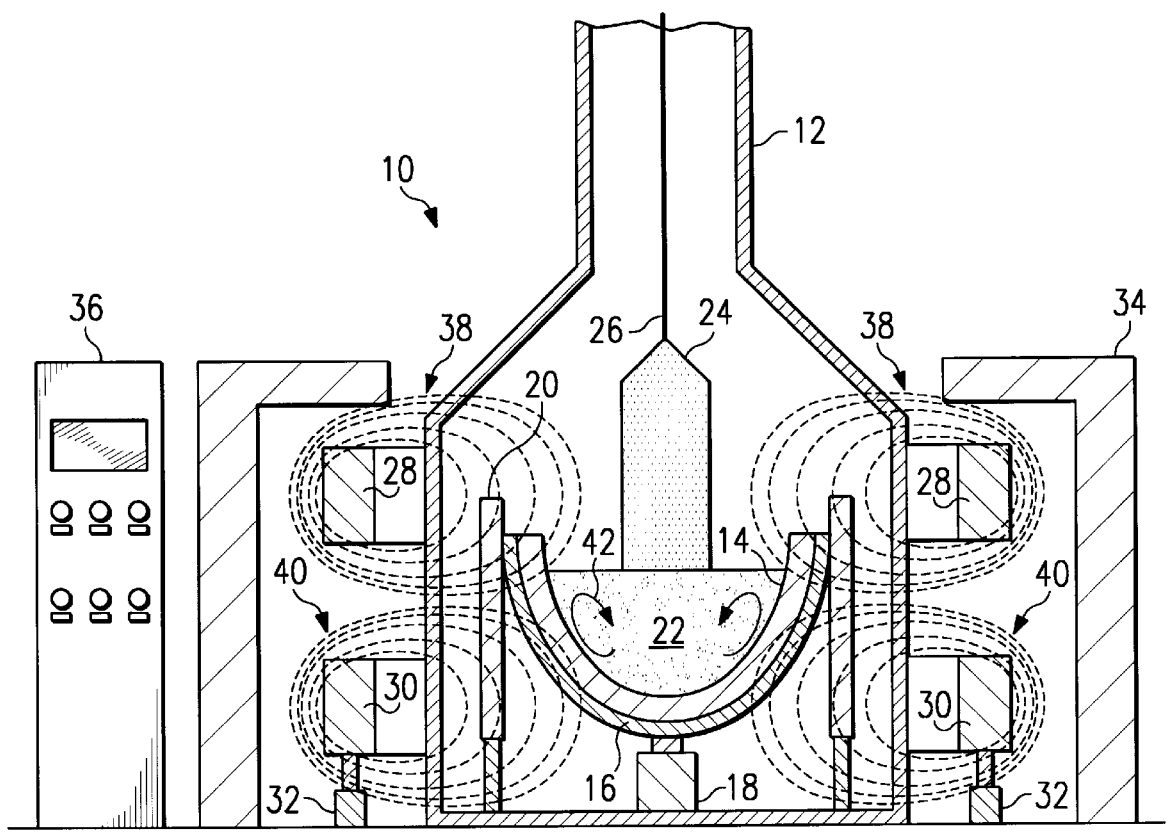
FIG. 3 is a schematic diagram of an apparatus for producing silicon crystals in operation having the cusp magnets in a second position.

Referring to FIGS. 2 and 3, an apparatus for producing silicon crystals using variable cusp magnets is depicted in operation. Silicon crystal 24 is produced from silicon melt 22 contained within crucible 14. Heater 20 provides heat to silicon melt 22 which causes silicon flux 42. Silicon flux 42 is a result of the temperature gradients and density gradients within silicon melt 22. Silicon flux 42 causes a swirling effect in which the silicon 22 near the surface of crucible 14 rises while the silicon 22 near the center of crucible 14 falls, thereby mixing oxygen produced in a reaction along the interface between the silicon melt 22 and the quartz of crucible 14.

In order to control silicon flux, cusp magnet 28 is energized to produce magnetic flux 38 and cusp magnet 30 is energized to produce magnetic flux 40. Magnetic flux 38 may be positively charged while magnetic flux 40 is negatively charged, or magnetic flux 38 may be negatively charged while magnetic flux 40 is positively charged. In either configuration, the magnetic flux 38 and magnetic flux 40 repel one another. Magnetic flux 38 and magnetic flux 40 reduce silicon flux 42 in melt 22 to reduce the mixing of oxygen within silicon melt 22.

In FIG. 2, the distance between cusp magnet 28 and cusp magnet 30 is greater than the distance between cusp magnet 28 and cusp magnet 30 in FIG. 3. For example, the distance between cusp magnet 28 and cusp magnet 30 may be nine inches while the distance between cusp magnet 28 and cusp magnet 30 in FIG. 3 may be five inches. The distance between cusp magnet 28 and cusp magnet 30 affects silicon flux 42. In FIG. 2, silicon flux 42 is greater than silicon flux 42 in FIG. 3. The distance between cusp magnet 28 and cusp magnet 30 is selected based upon the desired characteristics of silicon crystal 24. After determining the desired characteristics, the distance between cusp magnet 28 and cusp magnet 30 may be adjusted. This adjustment may take place between crystal production runs or during crystal production runs.

The following is an example of specific characteristics which may be achieved by varying the distance between cusp magnet 28 and cusp magnet 30.

EXAMPLE

| Distance | Radial Oxygen Gradient | Axial Oxygen Gradient |
| --- | --- | --- |
| 9" | 5% | 15% |
| 7" | 3% | 2.5% |
| 5" | <3% | <2.5% |

The example shows the change in the characteristics of silicon crystal 24 as the distance between cusp magnet 28 and cusp magnet 30 is varied. The silicon crystals 24 used to compile the data in the example were 200 mm crystals. In the example, "distance" represent the vertical distance between cusp magnet 28 and cusp magnet 30. "Radial Oxygen Gradient" (ROG) represents a ratio of the oxygen near the center of the silicon crystal 24 compared to the oxygen near the outer edge of the silicon crystal 24, specifically, ROG was calculated using the formula:

$$ROG=((O_{2\ center}-O_2\ 10mm\ from\ the\ edge)/O_{2\ center})\star 100\%.$$

"Axial oxygen gradient" (AOG) represents a ratio of the maximum oxygen level, generally near the top of the silicon crystal, as compared to the minimum oxygen level, generally near the bottom of the silicon crystal, specifically, AOG was calculated using the formula:

$$AOG=((O_{2\ max}-O_{2\ min})/O_{2\ ave})\star 100\%.$$

The example shows that both ROG and AOG are reduced by decreasing the distance between cusp magnet 28 and cusp magnet 30. The ROG ranges from five percent when the distance between cusp magnet 28 and cusp magnet 30 is nine inches to less than three percent when the distance between cusp magnet 28 and cusp magnet 30 is five inches. Similarly, the AOG ranges from fifteen percent when the distance between cusp magnet 28 and cusp magnet 30 is nine inches to less than two and a half percent when the distance between cusp magnet 28 and cusp magnet 30 is five inches. Even though the data in this example is confined to 200 mm silicon crystals 24, it should be understood by one skilled in the art that using adjustable cusp magnets 28, 30 during the production of larger silicon crystals 24, such as 400 mm silicon crystals 24, would result in a similar reduction in ROG and AOG as the distance between cusp magnet 28 and cusp magnet 30 is reduced, such result is contemplated within the present invention.

While this invention has been described with reference to illustrative embodiments, this description is not intended to be construed in a limiting sense. Various modifications and combinations of the illustrative embodiments as well as other embodiments of the invention will be apparent to persons skilled in the art upon reference to the description. It is, therefore, intended that the appended claims encompass any such modifications or embodiments.

What is claimed is:

1. An apparatus for producing silicon crystals from a silicon melt comprising:

a furnace;

a crucible disposed within said furnace for containing the silicon melt;

a heater disposed around said crucible for heating the silicon melt;

an upper magnet disposed around said furnace;

a lower magnet disposed around said furnace and a distance apart from said upper magnet, wherein said distance between said upper magnet and said lower magnet is variable; and a shield for reducing magnetic fields emanating outside of said apparatus, said upper magnet and said lower magnet disposed between said shield and said furnace and said shield extending from a point lower than the bottom of said lower magnet to a point above the top of said upper magnet and extending over said upper magnet.

2. The apparatus as recited in claim 1 wherein the position of said upper magnet is constant relative to said furnace and wherein the position of said lower magnet is variable relative to said furnace to allow adjustment of said distance between said upper magnet and said lower magnet.

3. The apparatus as recited in claim 1 wherein the position of said lower magnet is constant relative to said furnace and wherein the position of said upper magnet is variable relative to said furnace to allow adjustment of said distance between said upper magnet and said lower magnet.

4. The apparatus as recited in claim 1 wherein said upper magnet is fixed relative to said furnace and said lower magnet is supported by an adjustable platform which provides for upward and downward motion of said lower magnet, thereby controlling said distance between said upper magnet and said lower magnet.

5. The apparatus as recited in claim 1 wherein said distance between said upper magnet and said lower magnet is manually adjustable.

6. The apparatus as recited in claim 1 wherein said distance between said upper magnet and said lower magnet is computer controlled.

7. The apparatus as recited in claim 1 wherein said distance between said upper magnet and said lower magnet is adjustable between crystal production runs.

8. The apparatus as recited in claim 1 wherein said distance between said upper magnet and said lower magnet is adjustable during crystal production runs.

* * * * *